(12) United States Patent
Jezewski et al.

(10) Patent No.: US 9,736,936 B2
(45) Date of Patent: Aug. 15, 2017

(54) ELECTRONIC FABRIC WITH INCORPORATED CHIP AND INTERCONNECT

(71) Applicant: Intel Corporation, Santa Clara, CA (US)

(72) Inventors: Christopher Jezewski, Hillsboro, OR (US); Ravi Pillarisetty, Portland, OR (US); Brian Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/012,557

(22) Filed: Feb. 1, 2016

(65) Prior Publication Data

US 2016/0242279 A1    Aug. 18, 2016

Related U.S. Application Data

(63) Continuation of application No. 14/136,428, filed on Dec. 20, 2013, now Pat. No. 9,253,884.

(51) Int. Cl.
| | |
|---|---|
| *H01L 21/44* | (2006.01) |
| *H05K 1/03* | (2006.01) |
| *D03D 1/00* | (2006.01) |
| *D03D 11/02* | (2006.01) |

(Continued)

(52) U.S. Cl.
CPC ........... *H05K 1/038* (2013.01); *D03D 1/0088* (2013.01); *D03D 11/02* (2013.01); *D03D 15/00* (2013.01);

(Continued)

(58) Field of Classification Search
CPC .......... H05K 3/10; H05K 1/028; H05K 1/038; H05K 1/0393; H05K 3/0058; H05K 3/32; D03D 1/0088
USPC ........................................................ 438/614
See application file for complete search history.

(56) References Cited

U.S. PATENT DOCUMENTS 6,729,025 B2 * 5/2004 Farrell ............... B32B 5/02
                                                      29/825
7,638,885 B2 * 12/2009 Yoo ................ H01L 23/14
                                                      257/784

(Continued)

FOREIGN PATENT DOCUMENTS

| CN | 101266954 A | 9/2008 |
| CN | 104723640 A | 6/2015 |

OTHER PUBLICATIONS

"U.S. Appl. No. 14/136,428, Non Final Office Action mailed Jun. 5, 2015", 11 pgs.

(Continued)

*Primary Examiner* — Luan C Thai
(74) *Attorney, Agent, or Firm* — Schwegman Lundberg & Woessner, P.A.

(57) ABSTRACT

A system comprises an article comprising one or more fabric layers, a plurality of electronic devices, each being incorporated into or onto one of the one or more fabric layers, and one or more communication links between two or more of the plurality of electronic devices. Each of the plurality of electronic devices can comprise a flexible substrate coupled to the fabric layer, one or more metallization layers deposited on the flexible substrate, and one or more electronic components electrically coupled to the one or more metallization layers.

20 Claims, 2 Drawing Sheets

(51) Int. Cl.
*D03D 15/00* (2006.01)
*H05K 3/00* (2006.01)
*H05K 1/02* (2006.01)
*H05K 3/10* (2006.01)
*H05K 3/32* (2006.01)
*H05K 1/18* (2006.01)
*H05K 3/28* (2006.01)

(52) U.S. Cl.
CPC ............ *H05K 1/028* (2013.01); *H05K 1/0393* (2013.01); *H05K 3/0058* (2013.01); *H05K 3/10* (2013.01); *H05K 3/28* (2013.01); *H05K 3/32* (2013.01); *H05K 1/189* (2013.01); *H05K 3/284* (2013.01); *H05K 2201/015* (2013.01); *H05K 2201/0145* (2013.01); *H05K 2201/0154* (2013.01); *H05K 2201/0158* (2013.01); *H05K 2201/029* (2013.01)

(56) References Cited

U.S. PATENT DOCUMENTS

| | | | |
|---|---|---|---|
| 7,808,098 B2 * | 10/2010 | Sugiyama | H01L 23/145 257/702 |
| 8,259,460 B2 | 9/2012 | Bhattacharya et al. | |
| 9,253,884 B2 | 2/2016 | Jezewski et al. | |
| 2006/0289469 A1 | 12/2006 | Chandra et al. | |
| 2008/0258314 A1 | 10/2008 | Yoo et al. | |
| 2015/0181692 A1 | 6/2015 | Jezewski et al. | |

OTHER PUBLICATIONS

"U.S. Appl. No. 14/136,428, Notice of Allowance mailed Sep. 25, 2015", 7 pgs.

"U.S. Appl. No. 14/136,428, Response filed Sep. 8, 2015 to Non Final Office Action mailed Jun. 5, 2015", 13 pgs.

"Chinese Application Serial No. 201410858224.6, Office Action mailed Mar. 2, 2016", W/Machine Translation, 20 pgs.

"Chinese Application Serial No. 201410858224.6, Office Acton mailed Oct. 19, 2016", W/Machine Translation, 20 pgs.

"Chinese Application Serial No, 201410858224.6, Response filed Jan. 3, 2017 to Office Action mailed Oct. 19, 2016", W/English Claims, 7 pgs.

"Chinese Application Serial No. 201410858224.6, Response filed Jul. 18, 2016 to Office Action mailed Mar. 2, 2016", W/English Claims, 13 pgs.

\* cited by examiner

ELECTRONIC FABRIC WITH INCORPORATED CHIP AND INTERCONNECT

PRIORITY APPLICATION

This application is a continuation of U.S. application Ser. No. 14/136,428, filed Dec. 20, 2013, which is incorporated herein by reference in its entirety.

TECHNICAL FIELD

Embodiments described herein generally relate to methods for assembling electronic devices for incorporation with fabric or other flexible structures.

BACKGROUND

Electronic devices have become ubiquitous. For example, computing devices, and in particular portable computing devices such as smart phones and tablet computing devices, have become nearly universally used. However, current portable computing devices are limited by their form factor such that highly specialized applications cannot be performed without specialized equipment.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

This disclosure describes electronics devices that can be incorporated into fabrics or other flexible substrates or structures. This disclosure further describes resulting products that include a fabric incorporated with one or more electronic devices to form a "smart" fabric. The electronics devices and smart fabrics can be used for a variety of applications. In an example, the electronics devices and smart fabrics can comprise a wearable device, such as in human clothing, for various functions including, but not limited to, navigation, health monitoring, security, computing (such as for specific personal or professional tasks, social networking, file management), notification to the wearer (e.g., traffic alerts, local weather reports), or gesture or body position recognition.

Figure 1:
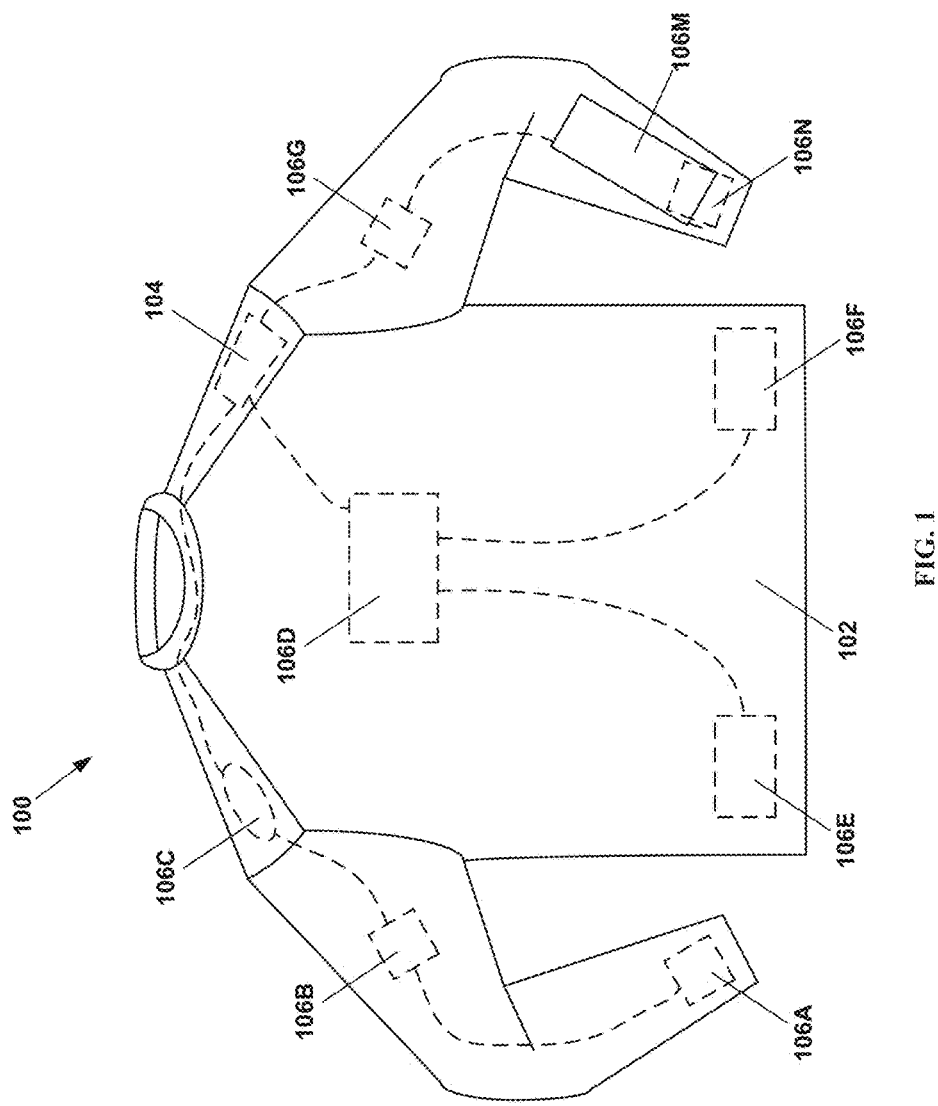
FIG. 1 is a conceptual view of an example system comprising a plurality of electronic devices incorporated into or onto an article having a fabric layer.

FIG. 1 shows a conceptual system-level view of electronic devices incorporated into a fabric to form a smart fabric. FIG. 1 shows an example system 100 comprising a wearable article of clothing, such as a shirt 102, with one or more electronic devices 104 and 106A-106N incorporated into or onto the fabric of the shirt 102. In an example, a first device 104 of the system 100 comprises at least one central controller 104 configured to communicate with the other electronics devices 106A-106N. The other electronics devices 106A-106N can comprise any other type of electronics device that may be desirable for the particular application for which the system 100 is configured. Examples of electronics devices 106A-106N include, but are not limited to, sensors, display devices (e.g., a computer monitor), computer input devices (e.g., a keyboard, touch screen, voice recognition device or system, or a gesture recognition device or sensor), communication components or devices (e.g., antennae, transmission devices, or receiving devices, such as wireless radios), and a power device (e.g., a battery or other electronic power device configured to electronically power one or more of the central controller 104 and the other electronics devices 106A-106N).

Examples of sensors that can be included as one or more of the electronics devices 106A-106N include, but are not limited to: biometric sensors such as heart rate sensors, body temperature sensors, or respiration sensors; orientation or position sensors such as accelerometers or gyroscopic sensors; location sensors such as global positioning system (GPS) devices or elevation sensors (for example, barometric elevation sensors); and environmental sensors such as external temperature sensors and humidity sensors.

The central controller 104 can comprise a processor configured to control or provide instructions to the other electronics devices 106A-106N. The central controller 104 can also include a memory and a communication module, such as a telemetry module for wireless communication with one or more of the other devices 106A-106N or a system bus for wired communication with one or more of the other devices 106A-106N. The processor of the central controller 104 can execute one or more instructions, which can be stored on the memory. The central controller 104 can transmit instructions to one or more of the electronics devices 106A-106N, such as via the communication module. The central controller 104 can also receive information from one or more of the other devices 106A-106N. In an example, the central controller 104 may not be the only controller in the system 100, but rather can comprise a plurality of controllers 104 working together or independently to control the system 100.

In an example, the system 100 can act as a computing system with the central controller 104 acting as the central processing unit and the other electronics device 106A-106N can act as one or more peripheral devices of the computing system that can include input and output devices and other peripheral devices each having certain functionality depending on the desired functionality of the system 100. In this way, the wearable system 100 can be as varied as the nearly limitless number of computing systems that have been and can be configured.

The central controller 104 can communicate with one or more of the other electronics devices 106A-106N through one or more hard cable communication links 108A-108N that are incorporated into or onto the fabric of the shirt 102. In addition to or alternative to cable connection, one or more of the other electronics devices 106A-106N can be configured to communication with the central controller 104 through one or more wireless communication links 110A-110N, such as a WiFi connection, a Bluetooth connection, or another standard or proprietary communication protocol. In an example, the one or more central controllers 104 and the electronic devices 106A-106N can be configured with a common protocol for communication between different types of components, such as a standard communication protocol.

The placement of each particular electronic device 104, 106A-106N within or upon the fabric article, e.g., the piece of clothing such as the shirt 102 shown in FIG. 1, can depend on the desired function of the device or the physical characteristics of the particular electronic device 104, 106A-106N, such as the footprint area of the device, the thickness of the device, the rigidity of the device (e.g., the ability of the device to bend or flex with the movement of the fabric), or the relative placement of the electronic components of the device 104, 106A-106N. For example, if a device has a very small footprint (e.g., less than_mm$^2$) and a very small thickness such that a user is unlikely to notice the electronic device, then it can be placed substantially anywhere on or within the fabric article. Similarly, if the device has a larger footprint or thickness but is substantially flexible along with the fabric, the device can potentially be placed anywhere on the fabric article with a sufficiently large surface area to accommodate the device. Also, if the device has packaged components, the device (or at least the packaged components) can be placed in a location of the fabric where there is expected to be one or more of minimal wear and tear, minimal flexing, minimal shock or vibration, and where there are multiple layers of cloth.

In some examples, one or more of the electronic devices 104, 106A-106N can have a relatively large footprint or thickness and can be substantially rigid, e.g., because of the makeup of the electronic components or the metallization layers that comprise the electronic device (described in more detail below with respect to FIGS. 2 and 3). Rigid devices can be positioned on or within the fabric article at a location that is already at least one of thicker, cushioned, and more rigid than just the fabric of the article. For example, when the system 100 includes an article of clothing such as a shirt 102 or pants (not shown), a rigid electronic device can be incorporated into or onto a sewn-on or adhered patch (e.g., a logo patch), decorative stitching, other decorative aspects (e.g., sewn-on or adhered appliques such as sequins, beading, and the like), a fastening device (e.g., a zipper, a button, a clasp, a clip, and the like), a seam, a pocket, or a shoulder area (e.g., a shirt with shoulder padding). For example, as shown in FIG. 1, the central controller 104 is incorporated into or on a shoulder area of the shirt 102, and another device 106C is incorporated into or onto the other shoulder area of the shirt 102.

In the example shown in FIG. 1, the system 100 can be configured to be used as a fitness monitoring of a user. The system 100 can include a piece of clothing such as the shirt 102 to be worn by the user, a central controller 104 and a variety of additional devices 106A-106N. The other devices 106 can include a heart rate monitor 106D, a GPS device 106C, and an input and display device 106M (e.g., a touchscreen device), a power supply device 106E (e.g., a battery device 106E), an external communication device 106F (e.g., a WiFi or Bluetooth radio 106F), and one or more motion or position sensors 106A, 106B, 106G, 106N (e.g., accelerometers or other positional or motion sensors). The central controller 104 and one or more of the other devices 106 can be incorporated onto or into the fabric of the shirt 102, for example as described below with respect to FIGS. 2 and 3. The central controller 104 can be configured, for example with software programming or firmware configuration, to receive data from one or more of the sensors, to receive data or instructions from the input and display device 106M, and to send data to be displayed on the input and display device 106M.

For example, the central controller 104 can receive heart beat information from the heart rate monitor 106D, positional information from the GPS device 106C, and motion or position data from the motion or position sensors 106A, 106B, 106G, 106N. The central controller 104 can be configured to manipulate the received data and to provide information to be displayed on a touchscreen of the input and display device 106M. For example, the central controller 104 and the input and display device 106M can be configured to display to the wearer of the shirt 102 information that can be desirable for fitness monitoring, such as current heart rate, distance traveled since the start of a workout, elevation (e.g., if one of the motion or position sensors 106A, 106B, 106G, 106N is an elevation sensor, such as a barometric sensor), current or average pace, etc. The input and display device 106M can also be manipulated by the user/wearer to control what is displayed.

In an alternative example, the system 100 of FIG. 1 can be configured as a portable general computing device that is incorporated into the shirt 102. In such a configuration, the system 100 can act as a wearable computer with similar functionality to that of a tablet computer or a mobile smartphone device. For example, the central controller 104 can act as a central processing unit, memory, etc. of the system 100. The input and display device 106M can include a touchscreen that can be used to enter information or commands from the user/wearer and to display information to the user/wearer. The other devices can include a GPS device 106C, a power supply 106E (e.g., a battery device 106E), and a radio 106G for communication with an external device (such as a WiFi radio, a global system for mobile communication (GSM) radio, an enhanced data rates for GSM evolution (EDGE) radio, a universal mobile telecommunications systems (UMTS) radio, a long term evolution (LTE) radio, an LTE Advanced radio, a code division multiple access (CDMA) radio, a enhanced voice-data only (EVDO) radio, a worldwide interoperability for microwave access (WiMAX) radio), or any other radio type that can be used for networking of a local or wide-area network). The other devices shown in FIG. 1 (e.g., devices 106A, 106B, 106F, and 106N) can either be one or more peripheral devices with functionality specific to a particular application for which the system 100 is designed, or can be omitted from the system 100 if one or more of the devices are not needed.

Figure 2:
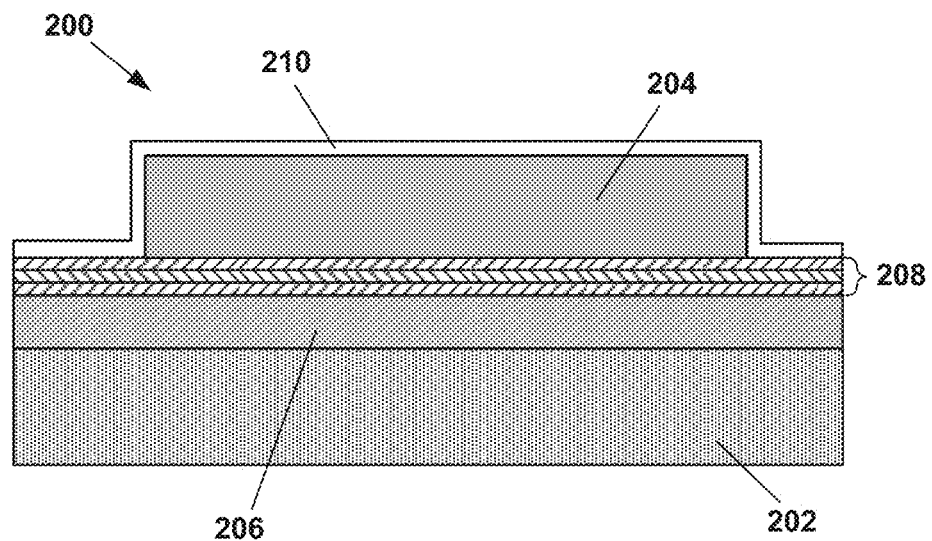
FIG. 2 is a cross-sectional view of an example electronic device coupled to a fabric layer.
Figure 3:
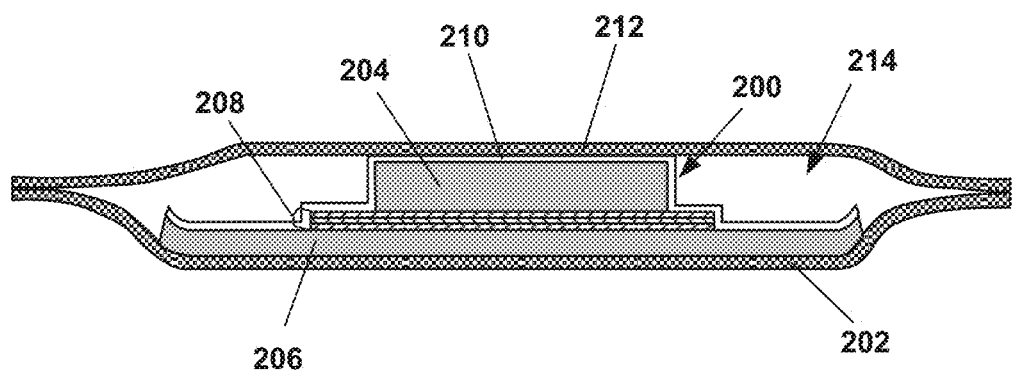
FIG. 3 is a cross-sectional view of an example electronic device coupled to a first fabric layer and sandwiched between the first fabric layer and a second fabric layer.

FIGS. 2 and 3 show an example of an electronic device 200 that can be incorporated into or onto a fabric substrate 202, such as a piece of fabric in an article of clothing. The device 200 can be used, for example, as one of the electronic devices 104, 106A-106N of the system 100 described above with respect to FIG. 1.

The device 200 can include one or more electronic components 204 mounted to a flexible substrate 206. The one or more electronic components 204 can comprise one or more semiconductor chips or dies that are used to provide for the electronic functionality of the device 200. One or more metallization layers 208 can be deposited onto the flexible substrate 206, for example by any of the methods of depositing metallization layers known in the art, to provide for interconnection within and among the one or more electronic components 204, for input/output communication to and from the one or more electronic components 204, and to provide a power and ground connection to the one or more electronic components 204. In an example, the metallization layers 208 can also be made to be flexible along with the flexible substrate, for example by being made to be very thin metallization layers that are flexible to a certain point. The metallization layers 208 can be made using standard flexible packaging techniques that are known in the art of electronics packaging. Flexible packaging techniques that can be used to deposit the metallization layers 208 are described, for example, in Zhang et al., "Fast Flexible Electronics Using Transferrable Silicon Nanomembranes," J. Phys. D: Appl. Phys., Vol. 45, No. 14, p. 143001 (2012); Nomura et al., "Room-Temperature Fabrication of Transparent Flexible Thin-Film Transistors Using Amorphous Oxide Semiconductors," Nature, vol. 432, p. 488 (2004); Liu et al., "Large-Scale Integration of Semiconductor Nanowires for High-Performance Flexible Electronics," ACS Nano, vol. 6, Issue 3, p. 1888 (2012); and Takahashi et al., "Parallel Array InAs Nanowire Transistors for Mechanically Bendable, Ultrahigh Frequency Electronics," ACS Nano, vol. 4, Issue 10, p. 5855 (2010), the entire disclosures of which are incorporated herein by reference.

The one or more electronic components 204 can be mounted to the flexible substrate and the metallization layers 208 using any technique known in the art for mounting electronic components to a substrate, such as flip chip or wirebond processing techniques. The one or more electronic components 204 can be molded if desired, for example to provide for mechanical protection or for environmental sealing.

The flexible substrate 206 can comprise a thin polymer layer that is capable of flexing, such as a polyimide substrate, a polyethylene terephthalate (PET) substrate, polyethylene naphthalate (PEN) substrate, a polycarbonate substrate, or thin glass substrates (such as Corning WILLOW GLASS). In an example, the flexible substrate 206 can comprise a Kapton film (e.g., poly(4,4'-oxydiphenylene-pyromellitimide)). The flexible substrate 206 can also include an adhesive applied to a surface that is to be adhered to the fabric substrate 202. For example, the flexible substrate 206 can be in the form of a tape, such as a Kapton Tape, having an adhesive, such as a silicone-based adhesive.

The fabric substrate 202 can comprise a portion of an article comprising fabric, such as an article of clothing, upholstery of a piece of furniture, or a piece of fabric in a bag or other piece of luggage. In an alternative example, the fabric substrate 202 can be another type of flexible substrate other than a fabric, such as a flexible polymer substrate.

The flexible substrate 206 can be coupled to the fabric substrate 202, such as via stitching, an adhesive, or welding. The flexible substrate 206 can be in the form of a tape that can be adhered to the fabric substrate 202. In an example, the flexible substrate 206 can be coupled to the fabric substrate 206 so that the flexible substrate 206 and the fabric substrate 202 can move together. For example, as shown in FIG. 3, the flexible substrate 206 can be coupled to the fabric substrate 202 so that the flexible substrate 206 and the fabric substrate 202 flex or bend together substantially as a single layer of material.

Each individual electronic component 204 can have different functionality, and thus each individual electronic component 204 can have a different die and substrate design. However, in an example, the form factor for input/output connections and power/ground connections can be a standard or uniform form factor regardless of the individual functionality, die design, and substrate design of the particular electronic component 204, e.g., with the number of input/output connections or power connections, and the location of each particular input/output or power connection being standardized, whether a particular device utilized the entire functionality of the standardized array or not. The standard form factor can provide for the different functionalities of each of the electronic components 204 to be integrated easily together with little or no setup required. In such an example, because the signaling protocol and the input/output maps (e.g., of a ball grid array) for all electronic components 204 are the same, the interconnect design of the metallization layers 208 and the corresponding ball out configuration of the overall electronic device 200 can be very similar, or even identical, for all electronic components 204.

The one or more electronic components 204 can be mounted, e.g., surface mounted, on top of the flexible substrate 206 and the metallization layers 208. The metallization layers 208 can provide interconnects that can allow the electronic components 204 to communicate with each other or with an external electronic device, such as a central processing unit, and can also provide power/ground connections for each flexible substrate 206 and metallization layer 208 combination.

Alternative to or in addition to surface mounting, the flexible substrate 206 and the metallization layers 208 can include one or more connectors into which the one or more electronic components 204 can be socketed or snapped into. A releasable connector, a releasable socket, or a releasable snapping configuration can provide for better interchangeability of the one or more electronic components 204, e.g., to provide for replacement of a damaged electronic component 204 or to change the functionality of a particular electronic component 204, e.g., to upgrade the electronic component 204.

In an example, the electronic device 200 can be configured to operate substantially independent of other devices, including independently of a power source. In such an example, one or more of the electronic components 204 can include a battery to provide electrical power to the electronic device 200. The battery can be connected to the metallization layers 208 and the flexible substrate 206 in the same way as the other electronic components 204. In an example, the battery can be a rechargeable battery that is rechargeable by one or more of wireless (e.g., inductive) charging; wired charging (e.g., with a port for a power cord); motion-capture charging (e.g., by capturing kinetic energy from the motion of electronic device 200 or the fabric substrate 202, for example if the electronic device 200 is incorporated into or onto an article of human clothing); and solar charging (e.g., using a photovoltaic cell).

At least a portion of the electronic device 200 can be coated with a coating 210 that can protect electronic portions of the device 200, such as the one or more electronic components 204, the metallization layers 208, and any other electrically conducting structures such as contact pads, wires, traces, and the like (not shown). The coating 210 can be configured to provide mechanical protection to semiconductor chips, circuits, and packages that make up the one or more electronic components 204 and to the structures of the metallization layers 208 and the other electrically conducting structures. The coating 210 can be configured to provide for environmental protection for the device 200, such as by providing a seal to prevent or reduce the ingress of moisture or other corrosive materials into the one or more electronic components 204, the metallization layers 208, or the electrical conductors. The coating 210 can be applied to any portion of the device 200 that is desired to be mechanically protected, environmentally sealed, or both. The coating 210 can be applied to all exposed surfaces of the electronic device 200 (e.g., any surface that is not in contact or covered by the flexible substrate 206), e.g., as shown in FIG. 3. The coating 210 can also be applied to only select portions of the one or more electronic components 204, the metallization layers 208, and the electrical conducting structures.

The coating 210 can be deposited by any method known in the art for depositing mechanically protecting and/or environmentally sealing materials to electronic devices, including, but not limited to, spray coating, dip coating, spin coating, chemical vapor deposition, and physical vapor deposition. Examples of materials that can be used to form the coating 210 include, but are not limited to, poly(p-xylylene) (Parylene) coatings, such as a chemical vapor deposited parylene coating, with or without fluorinated (Teflon) species; polystyrene (PS) coatings; polymethylmethacrylate (PMMA) propylene coatings; ethylene-methyl methacrylate copolymer (EMMA) coatings; polyether ether ketone (PEEK) coatings; nylon coatings; phenolic epoxy coatings; ethylene tetrafluoroethylene (ETFE, such as Tefzel) coatings; and coatings comprising post-consumer commingled polymer.

In an example, the electronic device 200 can be enclosed or encased by two or more layers of fabric. For example, as shown in FIG. 3, the electronic device can be coupled to a first fabric substrate 202 on a first side of the electronic device 200 (e.g., on the bottom side shown in FIG. 3). A second fabric substrate 212 can be coupled with the first fabric substrate 202 to form a pocket 214 between the fabric substrates 202, 212 in which the electronic device 200 can be located. The plurality of fabric layers or substrates 202, 212 can be coupled together by standard textile techniques, such as stitching or adhesive. Once the electronic device 200 is positioned at its desired location along the fabric substrates 202, 212, the pocket 214 can be formed by stitching or adhering the fabric substrates 202, 212 together to enclose or encapsulate the electronic device 200 to hold the electronic device 200 in place.

To better illustrate the method and apparatuses disclosed herein, a non-limiting list of embodiments is provided here:

EMBODIMENT 1 can include subject matter (such as an apparatus, a device, a method, or one or more means for performing acts), such as can include an electronic device comprising a flexible substrate configured to be mountable to a fabric layer, one or more metallization layers deposited on the flexible substrate, and one or more electronic components electrically coupled to the one or more metallization layers.

EMBODIMENT 2 can include, or can optionally be combined with the subject matter of EMBODIMENT 1, to optionally include a coating applied over at least one of one or more of the electronic components.

EMBODIMENT 3 can include, or can optionally be combined with the subject matter of EMBODIMENT 2, to optionally include the coating being configured to provide mechanical protection to the one or more electronic components.

EMBODIMENT 4 can include, or can optionally be combined with the subject matter of one or both of EMBODIMENTS 2 and 3, to optionally include the coating being configured to provide environmental protection to the one or more electronic components.

EMBODIMENT 5 can include, or can optionally be combined with the subject matter of one or any combination of EMBODIMENTS 1-4, to optionally include a coating applied over at least a portion of an exposed surface or exposed surfaces of the one or more metallization layers.

EMBODIMENT 6 can include, or can optionally be combined with the subject matter of EMBODIMENT 5, to optionally include the coating being configured to provide mechanical protection to at least the portion of the exposed surface or exposed surfaces of the one or more metallization layers.

EMBODIMENT 7 can include, or can optionally be combined with the subject matter of one or both of EMBODIMENTS 5 and 6, to optionally include the coating being configured to provide environmental protection to at least the portion of the exposed surface or exposed surfaces of the one or more metallization layers.

EMBODIMENT 8 can include, or can optionally be combined with the subject matter of one or any combination of EMBODIMENTS 3-7, to optionally include the coating being applied over at least one of the one or more electronic components and over at least a portion of the exposed surface or exposed surfaces of the one or more metallization layers.

EMBODIMENT 9 can include, or can optionally be combined with the subject matter of one or any combination of EMBODIMENTS 3-7, to optionally include the coating being applied over all of the one or more electronic components and all or substantially all of the exposed surface or exposed surfaces of the one or more metallization layers.

EMBODIMENT 10 can include, or can optionally be combined with the subject matter of one or any combination of EMBODIMENTS 3-9, to optionally include the coating comprising at least one of poly(p-xylylene), polystyrene, polymethylmethacrylate, polypropylene, ethylene-methyl methacrylate copolymer, polyether ether ketone, nylon, phenolic epoxy, ethylene tetrafluoroethylene, and post-consumer commingled polymer.

EMBODIMENT 11 can include, or can optionally be combined with the subject matter of one or any combination of EMBODIMENTS 1-10, to optionally include the flexible substrate comprising at least one of a polyimide, polyethylene terephthalate (PET), polyethylene naphthalate (PEN), a polycarbonate, glass, and Kapton.

EMBODIMENT 12 can include, or can optionally be combined with the subject matter of one or any combination of EMBODIMENTS 1-11, to optionally include the one or more metallization layers comprising one or more interconnects for electrically connecting a first one of the one or more electronic components to a second one of the one or more electronic components.

EMBODIMENT 13 can include, or can optionally be combined with the subject matter of one or any combination of EMBODIMENTS 1-12, to optionally include the one or more metallization layers comprising one or more interconnects for electrically connecting a first one of the one or more electronic components to an external electronic device.

EMBODIMENT 14 can include, or can optionally be combined with the subject matter of one or any combination of EMBODIMENTS 1-13, to optionally include a form factor for input/output connections and power/ground connections for each of the one or more electronic components is a standard or uniform form factor regardless of individual functionality, die design, or substrate design of a particular electronic component.

EMBODIMENT 15 can include, or can optionally be combined with the subject matter of one or any combination of EMBODIMENTS 1-14, to optionally include the electronic coupling between a first one of the one or more electronic components and the one or more metallization layer comprising at least one of a releasable connector, a socket, and a snapping configuration.

EMBODIMENT 16 can include, or can optionally be combined with the subject matter of one or any combination of EMBODIMENTS 1-15, to optionally include the one or more electronic components comprising at least one of a sensor, a display component, a communication component, a processor, a memory, a system bus, and a power device.

EMBODIMENT 17 can include, or can optionally be combined with the subject matter of one or any combination of EMBODIMENTS 1-16, to optionally include the one or more electronic components including at least one sensor comprising at least one of biometric sensor, at least one orientation sensor, at least one position sensor, and lease one location sensor, a global positioning system (GPS) sensor, and an environmental sensor.

EMBODIMENT 18 can include, or can optionally be combined with the subject matter of one or any combination of EMBODIMENTS 1-17, to include subject matter (such as an apparatus, a device, a method, or one or more means for performing acts), such as can include a system comprising a fabric layer and an electronic device. The electronic device can comprise a flexible substrate coupled to the fabric layer, one or more metallization layers deposited on the flexible substrate, and one or more electronic components electrically coupled to the one or more metallization layers.

EMBODIMENT 19 can include, or can optionally be combined with the subject matter of EMBODIMENT 18, to optionally include a second fabric layer coupled to the fabric layer.

EMBODIMENT 20 can include, or can optionally be combined with the subject matter of EMBODIMENT 18, to optionally include the electronic device being positioned between the fabric layer and the second fabric layer.

EMBODIMENT 21 can include, or can optionally be combined with the subject matter of one or any combination of EMBODIMENTS 18-20, to optionally include a coating applied over at least one of one or more of the electronic components.

EMBODIMENT 22 can include, or can optionally be combined with the subject matter of EMBODIMENT 21, to optionally include the coating being configured to provide mechanical protection to the one or more electronic components.

EMBODIMENT 23 can include, or can optionally be combined with the subject matter of one or both of EMBODIMENTS 21 and 22, to optionally include the coating being configured to provide environmental protection to the one or more electronic components.

EMBODIMENT 24 can include, or can optionally be combined with the subject matter of one or any combination of EMBODIMENTS 18-23, to optionally include a coating applied over at least a portion of an exposed surface or exposed surfaces of the one or more metallization layers.

EMBODIMENT 25 can include, or can optionally be combined with the subject matter of EMBODIMENT 24, to optionally include the coating being configured to provide mechanical protection to at least the portion of the exposed surface or exposed surfaces of the one or more metallization layers.

EMBODIMENT 26 can include, or can optionally be combined with the subject matter of one or both of EMBODIMENTS 24 and 25, to optionally include the coating being configured to provide environmental protection to at least the portion of the exposed surface or exposed surfaces of the one or more metallization layers.

EMBODIMENT 27 can include, or can optionally be combined with the subject matter of one or any combination of EMBODIMENTS 22-26, to optionally include the coating being applied over at least one of the one or more electronic components and over at least a portion of the exposed surface or exposed surfaces of the one or more metallization layers.

EMBODIMENT 28 can include, or can optionally be combined with the subject matter of one or any combination of EMBODIMENTS 22-26, to optionally include the coating being applied over all of the one or more electronic components and all or substantially all of the exposed surface or exposed surfaces of the one or more metallization layers.

EMBODIMENT 29 can include, or can optionally be combined with the subject matter of one or any combination of EMBODIMENTS 21-28, to optionally include the coating comprising at least one of poly(p-xylylene), polystyrene, polymethylmethacrylate, polypropylene, ethylene-methyl methacrylate copolymer, polyether ether ketone, nylon, phenolic epoxy, ethylene tetrafluoroethylene, and post-consumer commingled polymer.

EMBODIMENT 30 can include, or can optionally be combined with the subject matter of one or any combination of EMBODIMENTS 18-29, to optionally include the flexible substrate comprising at least one of a polyimide, polyethylene terephthalate (PET), polyethylene naphthalate (PEN), a polycarbonate, glass, and Kapton.

EMBODIMENT 31 can include, or can optionally be combined with the subject matter of one or any combination of EMBODIMENTS 18-30, to optionally include the one or more metallization layers comprising one or more interconnects for electrically connecting a first one of the one or more electronic components to a second one of the one or more electronic components.

EMBODIMENT 32 can include, or can optionally be combined with the subject matter of one or any combination of EMBODIMENTS 18-31, to optionally include the one or more metallization layers comprising one or more interconnects for electrically connecting a first one of the one or more electronic components to an external electronic device.

EMBODIMENT 33 can include, or can optionally be combined with the subject matter of one or any combination of EMBODIMENTS 18-32, to optionally include a form factor for input/output connections and power/ground connections for each of the one or more electronic components is a standard or uniform form factor regardless of individual functionality, die design, or substrate design of a particular electronic component.

EMBODIMENT 34 can include, or can optionally be combined with the subject matter of one or any combination of EMBODIMENTS 18-35, to optionally include the electronic coupling between a first one of the one or more electronic components and the one or more metallization layer comprising at least one of a releasable connector, a socket, and a snapping configuration.

EMBODIMENT 35 can include, or can optionally be combined with the subject matter of one or any combination of EMBODIMENTS 18-34, to optionally include the one or more electronic components comprising at least one of a sensor, a display component, a communication component, a processor, a memory, a system bus, and a power device.

EMBODIMENT 36 can include, or can optionally be combined with the subject matter of one or any combination of EMBODIMENTS 18-35, to optionally include the one or more electronic components including at least one sensor comprising at least one of biometric sensor, at least one orientation sensor, at least one position sensor, and lease one location sensor, a global positioning system (GPS) sensor, and an environmental sensor.

EMBODIMENT 37 can include, or can optionally be combined with the subject matter of one or any combination of EMBODIMENTS 18-36, to optionally include the fabric layer forming at least a part of an article of clothing.

EMBODIMENT 38 can include, or can optionally be combined with the subject matter of one or any combination of EMBODIMENTS 18-37, to optionally include the fabric layer forming at least a part of an article of furniture.

EMBODIMENT 39 can include, or can optionally be combined with the subject matter of one or any combination of EMBODIMENTS 18-38, to optionally include the fabric layer forming at least a part of an article of luggage.

EMBODIMENT 40 can include, or can optionally be combined with the subject matter of one or any combination of EMBODIMENTS 18-39, to optionally include the electronic device comprising at least one of a sensor, a display device, a computer input device, a communication device, a processor, a memory, and a power device.

EMBODIMENT 41 can include, or can optionally be combined with the subject matter of one or any combination of EMBODIMENTS 1-40, to include subject matter (such as an apparatus, a device, a method, or one or more means for performing acts), such as can include a system comprising an article comprising one or more fabric layers, a plurality of electronic devices, each being incorporated into or onto one of the one or more fabric layers, and one or more communication links between two or more of the plurality of electronic devices.

EMBODIMENT 42 can include, or can optionally be combined with the subject matter of EMBODIMENT 41, to optionally include the electronic device comprising a flexible substrate coupled to the fabric layer.

EMBODIMENT 43 can include, or can optionally be combined with the subject matter of EMBODIMENT 42, to optionally include the flexible substrate comprising at least one of a polyimide, polyethylene terephthalate (PET), polyethylene naphthalate (PEN), a polycarbonate, glass, and Kapton.

EMBODIMENT 44 can include, or can optionally be combined with the subject matter of one or any combination of EMBODIMENTS 42 and 43, to optionally include the electronic device comprising one or more metallization layers deposited on the flexible substrate.

EMBODIMENT 45 can include, or can optionally be combined with the subject matter of EMBODIMENT 44, to optionally include the one or more metallization layers comprising one or more interconnects for electrically connecting a first one of the one or more electronic components to a second one of the one or more electronic components.

EMBODIMENT 46 can include, or can optionally be combined with the subject matter of one or any combination of EMBODIMENTS 44 and 45, to optionally include the one or more metallization layers comprising one or more interconnects for electrically connecting a first one of the one or more electronic components to an external electronic device.

EMBODIMENT 47 can include, or can optionally be combined with the subject matter of one or any combination of EMBODIMENTS 44-46, to optionally include the electronic device comprising one or more electronic components electrically coupled to the one or more metallization layers.

EMBODIMENT 48 can include, or can optionally be combined with the subject matter of EMBODIMENT 47, to optionally include the electronic coupling between a first one of the one or more electronic components and the one or more metallization layer comprising at least one of a releasable connector, a socket, and a snapping configuration.

EMBODIMENT 49 can include, or can optionally be combined with the subject matter of one or any combination of EMBODIMENTS 47 and 48, to optionally include the electronic device comprising a coating applied over at least one of one or more of the electronic components.

EMBODIMENT 50 can include, or can optionally be combined with the subject matter of EMBODIMENT 49, to optionally include the coating being configured to provide mechanical protection to the one or more electronic components.

EMBODIMENT 51 can include, or can optionally be combined with the subject matter of one or both of EMBODIMENTS 49 and 50, to optionally include the coating being configured to provide environmental protection to the one or more electronic components.

EMBODIMENT 52 can include, or can optionally be combined with the subject matter of one or any combination of EMBODIMENTS 47-51, to optionally include the electronic device comprising a coating applied over at least a portion of an exposed surface or exposed surfaces of the one or more metallization layers.

EMBODIMENT 53 can include, or can optionally be combined with the subject matter of EMBODIMENT 52, to optionally include the coating being configured to provide mechanical protection to at least the portion of the exposed surface or exposed surfaces of the one or more metallization layers.

EMBODIMENT 54 can include, or can optionally be combined with the subject matter of one or both of EMBODIMENTS 52 and 53, to optionally include the coating being configured to provide environmental protection to at least the portion of the exposed surface or exposed surfaces of the one or more metallization layers.

EMBODIMENT 55 can include, or can optionally be combined with the subject matter of one or any combination of EMBODIMENTS 50-54, to optionally include the coating being applied over at least one of the one or more electronic components and over at least a portion of the exposed surface or exposed surfaces of the one or more metallization layers.

EMBODIMENT 56 can include, or can optionally be combined with the subject matter of one or any combination of EMBODIMENTS 50-55, to optionally include the coating being applied over all of the one or more electronic components and all or substantially all of the exposed surface or exposed surfaces of the one or more metallization layers.

EMBODIMENT 57 can include, or can optionally be combined with the subject matter of one or any combination of EMBODIMENTS 49-56, to optionally include the coating comprising at least one of poly(p-xylylene), polystyrene, polymethylmethacrylate, polypropylene, ethylene-methyl methacrylate copolymer, polyether ether ketone, nylon, phenolic epoxy, ethylene tetrafluoroethylene, and post-consumer commingled polymer.

EMBODIMENT 58 can include, or can optionally be combined with the subject matter of one or any combination of EMBODIMENTS 41-57, to optionally include the one or more communication links comprising a wired communication link.

EMBODIMENT 59 can include, or can optionally be combined with the subject matter of one or any combination of EMBODIMENTS 41-58, to optionally include the one or more communication links comprising a wireless communication link.

EMBODIMENT 60 can include, or can optionally be combined with the subject matter of one or any combination of EMBODIMENTS 41-59, to optionally include the article comprising a clothing article.

EMBODIMENT 61 can include, or can optionally be combined with the subject matter of one or any combination of EMBODIMENTS 41-60, to optionally include the article comprising a luggage article.

EMBODIMENT 62 can include, or can optionally be combined with the subject matter of one or any combination of EMBODIMENTS 41-61, to optionally include the article comprising a furniture article.

EMBODIMENT 63 can include, or can optionally be combined with the subject matter of one or any combination of EMBODIMENTS 41-62, to optionally include the plurality of electronic devices comprising at least one of a sensor, a display device, a computer input device, a communication device, a processor, a memory, and a power device.

These and other examples and features of the present electronic device, solder compositions, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method of making an electronic device comprising:
   depositing one or more metallization layers on a flexible substrate;
   coupling the flexible substrate to a first fabric layer; and
   electrically coupling a plurality of electronic components to the one or more metallization layers by forming one or more coupling connections in a form factor pattern that is a standard or uniform form factor regardless of individual functionality, die design, or substrate design of the particular electronic component.

2. The method according to claim 1, further comprising applying a coating over at least a portion of at least one of the plurality of electronic components and at least a portion of the one or more metallization layers, wherein the coating provides mechanical protection or environmental protection, or both, to the at least one of the plurality of electronic components and at least the portion of the one or more metallization layers onto which the coating is applied.

3. The method according to claim 2, wherein the coating comprises at least one of:
   poly(p-xylylene), polystyrene, polymethylmethacrylate, polypropylene, an ethylene-methyl methacrylate copolymer, polyether ether ketone, a nylon, a phenolic epoxy, ethylene tetrafluoroethylene, or a post-consumer commingled polymer.

4. The method according to claim 1, wherein the flexible substrate comprises at least one of:
   apolyimide, polyethylene terephthalate (PET), polyethylene naphthalate (PEN), a polycarbonate, glass, or Kapton.

5. The method according to claim 1, wherein the coupling of the flexible substrate to the first fabric layer comprises at least one of stitching the flexible substrate to the first fabric layer, adhering the flexible substrate to the first fabric layer, or welding the flexible substrate to the first fabric layer.

6. The method according to claim 1, wherein the flexible substrate comprises a tape with an adhesive layer, wherein the coupling of the flexible substrate to the first fabric layer comprises applying the adhesive layer of the tape to adhere the flexible substrate to the first fabric layer.

7. The method according to claim 1, further comprising coupling a second fabric layer to the first fabric layer so that the electronic device is positioned between the first fabric layer and the second fabric layer.

8. A method comprising:
   assembling a first electronic device, wherein the assembling of the first electronic device comprises the steps of:
   depositing one or more metallization layers on a flexible substrate;
   coupling the flexible substrate to a first fabric layer, and electrically coupling a plurality of electronic components to the one or more metallization layers by forming one or more coupling connections in a form factor pattern that is a standard or uniform form factor regardless of individual functionality, die design, or substrate design of the particular electronic component; and communicatively connecting the first electronic device to one or more second electronic devices to form a system.

9. The method according to claim 8, further comprising coupling a second fabric layer to the first fabric layer so that the first electronic device is positioned between the first fabric layer and the second fabric layer.

10. The method according to claim 8, wherein assembling the first electronic device further comprises applying a coating over at least a portion of at least one of the plurality of electronic components and at least a portion of the one or more metallization layers, wherein the coating provides mechanical protection or environmental protection, or both, to the at least one of the plurality of electronic components and the portion of the one or more metallization layers onto which the coating is applied.

11. The method according to claim 10, wherein the coating comprises at least one of poly(p-xylylene), polystyrene, polymethylmethacrylate, polypropylene, an ethylene-methyl methacrylate copolymer, polyether ether ketone, a nylon, a phenolic epoxy, ethylene tetrafluoroethylene, and a post-consumer commingled polymer.

12. The method according to claim 8, wherein the flexible substrate comprises at least one of a polyimide, polyethylene terephthalate (PET), polyethylene naphthalate (PEN), a polycarbonate, a glass, and Kapton.

13. The method according to claim 8, further comprising forming at least part of an article of clothing, an article of luggage, or an article of furniture with the first fabric layer.

14. The method according to claim 8, wherein communicatively connecting the first and second electronic devices comprises forming one or both of a wireless communication link or a wired communication link between the first and second electronic devices.

15. A method comprising:
assembling one or more fabric layers to create an article;
incorporating a plurality of electronic devices into or onto at least one of the one or more fabric layers, wherein at least one of the plurality of electronic devices comprises;
 a flexible substrate coupled to a first of the one or more of the fabric layers;
 one or more metallization layers deposited on the flexible substrate; and
 a plurality of electronic components electrically coupled to the one or more metallization layers with one or more coupling connections in a form factor pattern that is a standard or uniform form factor regardless of individual functionality, die design, or substrate design of the particular electronic component; and
connecting one or more communication links between two or more of the plurality of electronic devices.

16. The method according to claim 15, wherein the one or more communication links comprises one or more of at least one wired communication link and at least one wireless communication link.

17. The method according to claim 15, wherein the article comprises a clothing article, a luggage article, or a furniture article.

18. The method according to claim 1, wherein coupling the flexible substrate to the first fabric layer includes at least one of stitching, adhering, or welding the flexible substrate to the first fabric layer.

19. The method according to claim 8, wherein coupling the flexible substrate to the first fabric layer includes at least one of stitching, adhering, or welding the flexible substrate to the first fabric layer.

20. The method according to claim 15, wherein incorporating a plurality of electronic devices into or onto at the least one of the one or more fabric layers includes at least one of stitching, adhering, or welding the flexible substrate to the first fabric layer.

* * * * *

UNITED STATES PATENT AND TRADEMARK OFFICE
CERTIFICATE OF CORRECTION

PATENT NO. : 9,736,936 B2
APPLICATION NO. : 15/012557
DATED : August 15, 2017
INVENTOR(S) : Jezewski et al.

It is certified that error appears in the above-identified patent and that said Letters Patent is hereby corrected as shown below:

On the Title Page

On page 2, in Column 2, under "Other Publications", Line 7, delete "Acton" and insert --Action-- therefor On page 2, in Column 2, under "Other Publications", Line 9, delete "No," and insert --No.-- therefor Signed and Sealed this
Twenty-fourth Day of April, 2018

Andrei Iancu
*Director of the United States Patent and Trademark Office*